(12) United States Patent
Huang et al.

(10) Patent No.: US 7,674,410 B2
(45) Date of Patent: Mar. 9, 2010

(54) METHOD FOR MANUFACTURING A THERMAL INTERFACE MATERIAL

(75) Inventors: Hua Huang, Beijing (CN); Yang Wu, Beijing (CN); Chang-Hong Liu, Beijing (CN); Shou-Shan Fan, Beijing (CN)

(73) Assignees: Tsinghua University, Beijing (CN); Hon Hai Precision Industry Co., Ltd., Tu-Cheng, Taipei Hsien (TW)

( * ) Notice: Subject to any disclaimer, the term of this patent is extended or adjusted under 35 U.S.C. 154(b) by 648 days.

(21) Appl. No.: 11/321,316

(22) Filed: Dec. 29, 2005

(65) Prior Publication Data
US 2006/0231970 A1 Oct. 19, 2006

(30) Foreign Application Priority Data
Apr. 14, 2005 (CN) .................. 2005 1 0034239

(51) Int. Cl.
*B32B 3/30* (2006.01)
(52) U.S. Cl. .................. 264/134; 977/753; 977/789; 977/840; 977/842; 977/880
(58) Field of Classification Search .................. 264/18, 264/139, 163, 230, 81, 134, 129; 977/700, 977/724, 742, 743, 753, 778, 788, 789, 840, 977/842, 880, 900, 843
See application file for complete search history.

(56) References Cited

U.S. PATENT DOCUMENTS

| | | | | |
|---|---|---|---|---|
| 6,283,812 | B1 * | 9/2001 | Jin et al. ................... | 445/24 |
| 6,407,922 | B1 * | 6/2002 | Eckblad et al. ............. | 361/704 |
| 2002/0100581 | A1 * | 8/2002 | Knowles et al. ............. | 165/185 |
| 2003/0026973 | A1 * | 2/2003 | Pause ........................ | 428/310.5 |
| 2003/0111333 | A1 * | 6/2003 | Montgomery et al. ....... | 204/164 |
| 2003/0117770 | A1 * | 6/2003 | Montgomery et al. ....... | 361/687 |
| 2003/0203181 | A1 * | 10/2003 | Ellsworth et al. ........ | 428/307.3 |
| 2004/0009353 | A1 * | 1/2004 | Knowles et al. ........... | 428/411.1 |
| 2005/0136248 | A1 * | 6/2005 | Leu et al. ..................... | 428/332 |

FOREIGN PATENT DOCUMENTS

| | | |
|---|---|---|
| CN | 1501483 A | 6/2004 |
| JP | 11-302545 A | 11/1999 |

(Continued)

OTHER PUBLICATIONS

Pipes, Hubert; Helical carbon nanotube arrays: thermal expansion; Comp Sci Tech 63; (2003) 1571-1579.*

(Continued)

*Primary Examiner*—Joseph S. Del Sole
*Assistant Examiner*—John P Robitaille
(74) *Attorney, Agent, or Firm*—D. Austin Bonderer

(57) ABSTRACT

A method for manufacturing a thermal interface material comprising the steps of: providing a carbon nanotube array comprising a plurality of carbon nanotubes each having two opposite ends; forming a composite phase change material by filling clearances in the carbon nanotube array with a phase change material; forming a section with predetermined thickness by cutting the composite phase change material along a direction cross to an alignment direction of the carbon nanotubes; and heating up the section to a temperature higher than a phase change temperature of the phase change material and cooling down after the two opposite ends of the carbon nanotubes protruding out of the section.

15 Claims, 3 Drawing Sheets

FOREIGN PATENT DOCUMENTS

WO     WO 03/101891    * 12/2003

OTHER PUBLICATIONS

Huang, Liu, Wu, Fan; Aligned Carbon Nanotube Composite Films for Thermal Management; Adv. Mater.; 17 (2005) 1652-1656.*

Fan, Chapline, Franklin, Tombler, Cassel, Dai; Self-Oriented Regular Arrays of Carbon Nanotubes and Their Field Emission Properties; Science; 283 (1999) 512-514.*

Despres, Daguerre; Flexibility of grapheme layers in carbon nanotubes; Carbon; 33 (1995) 87-92.*

Ruoff, Lorents; Mechanical And Thermal Properties of Carbon Nanotubes; Carbon; 33 (1995) 925-930.*

Falvo, Clary, Taylor, Chi, Brooks, Washburn, Superfine; Bending and buckling of carbon nanotubes under large strain; Nature; 389 (1997) 582-584.*

Yakobson; Mechanical relaxation and "intramolecular plasticity" in carbon nanotubes; App. Phys. Let.; 72 (1998) 918-920.*

Huang, Xu, Ren, Wang, Siegal, Provencio; Growth of highly oriented carbon nanotubes by plasma-enhanced hot filament chemical vapor deposition; App. Phys. Let.; 73 (1998) 3845-3847.*

Xu, Fisher; Enhancement of thermal interface materials with carbon nanotube arrays; International Journal of Heat and Mass Transfer; 49 (2006) 1658-1666.*

Z. F. Ren, Z. P. Huang, J. W. Xu, J. H. Wang, P. Bush, M. P. Siegal, P. N. Provencio; Synthesis of Large Arrays of Well-Aligned Carbon Nanotubes on Glass; Science 282, 1105 (1998).*

C. Bower et al; Deformation of carbon nanotubes in nanotube-polymer composites; Applied Physics Letters; vol. 74 No. 22, p. 3317; May 31, 1999.*

P.M. Ajayan et al.; Aligned Carbon Nanotube Arrays Formed by Cutting a Ploymer Resin-Nanotube Composite; Science, vol. 265 p. 1212; Aug. 26, 1994.*

Z. F. Ren, Z. P. Huang, J. W. Xu, J. H. Wang, P. Bush, M. P. Siegal, P. N. Provencio; Synthesis of Large Arrays of Well-Aligned Carbon Nanotubes on Glass; Science 282, 1105 (1998).*

* cited by examiner

METHOD FOR MANUFACTURING A THERMAL INTERFACE MATERIAL

CROSS-REFERENCE TO RELATED APPLICATIONS

This application is related to five corresponding U.S. patent applications each entitled "THERMAL INTERFACE MATERIAL AND METHOD FOR MANUFACTURING SAME" with application Ser. No. 11/024,513, filed on Dec. 28, 2004, "METHOD FOR MANUFACTURING CARBON NANOTUBES WITH UNIFORM LENGTH" with application Ser. No. 11/025,160, filed on Dec. 28, 2004, "THERMAL INTERFACE MATERIAL AND METHOD FOR MANUFACTURING SAME" with application Ser. No. 11/089,864, filed on Mar. 25, 2005, "THERMAL INTERFACE MATERIAL AND METHOD FOR MAKING SAME" and "THERMAL INTERFACE MATERIAL AND METHOD FOR MANUFACTURING SAME", filed recently respectively, each having the same assignee as the instant application. The disclosures of the above-identified applications are incorporated herein by reference.

TECHNICAL FIELD

The present invention relates to thermal interface materials and manufacturing methods thereof, and more particularly to a thermal interface material which conducts heat by using carbon nanotubes, and a manufacturing method thereof.

BACKGROUND

Electronic components such as semiconductor chips are becoming progressively smaller, while at the same time heat dissipation requirements thereof are increasing. Commonly, a thermal interface material is utilized between the electronic component and a heat sink in order to efficiently dissipate heat generated by the electronic component.

A conventional thermal interface material is made by diffusing particles with a high heat conduction coefficient in a base material. The particles can be made of graphite, boron nitride, silicon oxide, alumina, silver, or other metals. However, a heat conduction coefficient of the thermal interface material is now considered to be too low for many contemporary applications, because it cannot adequately meet the heat dissipation requirements of modern electronic components.

An article entitled "Unusually High Thermal Conductivity of Carbon Nanotubes" and authored by Savas Berber (page 4613, Vol. 84, Physical Review Letters 2000) discloses that a heat conduction coefficient of a carbon nanotube can be 6600 W/m·K (watts/meter·Kelvin) at room temperature.

A kind of thermal interface material which conducts heat by using carbon nanotubes has been developed. The thermal interface material is formed by injection molding, and has a plurality of carbon nanotubes incorporated in a matrix material. A first surface of the thermal interface material engages with an electronic device, and a second surface of the thermal interface material engages with a heat sink. The second surface has a larger area than the first surface, so that heat can be uniformly spread over the larger second surface. But the thermal interface material formed by injection molding is relatively thick. This increases a bulk of the thermal interface material and reduces its flexibility. Furthermore, the carbon nanotubes are disposed in the matrix material randomly and multidirectionally. This means that heat does not necessarily spread uniformly through the thermal interface material. In addition, the heat does not necessarily spread directly from the first surface engaged with the electronic device to the second surface engaged with the heat sink.

A method for producing aligned carbon nanotube thermal interface structure is provided. In a batch process, a capacitor is immersed in a bath containing a slurry of thermoplastic polymer containing randomly oriented carbon nanotubes and energized to create an electrical field to orient the carbon nanotubes prior to curing.

However, the enhanced value for the thermal interface structure's thermal conductivity is still not satisfactory. An important reason is probably rest with the existence of thermal interface resistances between the overlaps in the carbon nanotube passage of the thermal interface structure, and this would lead to a rapid increase in the overall thermal resistance.

Therefore, a method for manufacturing a thermal interface material with good thermal conductivity is desired.

SUMMARY

A method for manufacturing a thermal interface material includes the steps of: providing a carbon nanotube array comprising a plurality of carbon nanotubes each having two opposite ends; forming a composite phase change material by filling clearances in the carbon nanotube array with a phase change material; forming a section with predetermined thickness by cutting the composite phase change material along a direction cross to an alignment direction of the carbon nanotubes; heating up the section to a temperature higher than a phase change temperature of the phase change material and cooling down after the two opposite ends of the carbon nanotubes protruding out of the section.

Other advantages and novel features will become more apparent from the following detailed description when taken in conjunction with the accompanying drawings, in which:

DETAILED DESCRIPTION OF THE EMBODIMENTS

The present invention is further described below and by reference to the figures.

Figure 1:
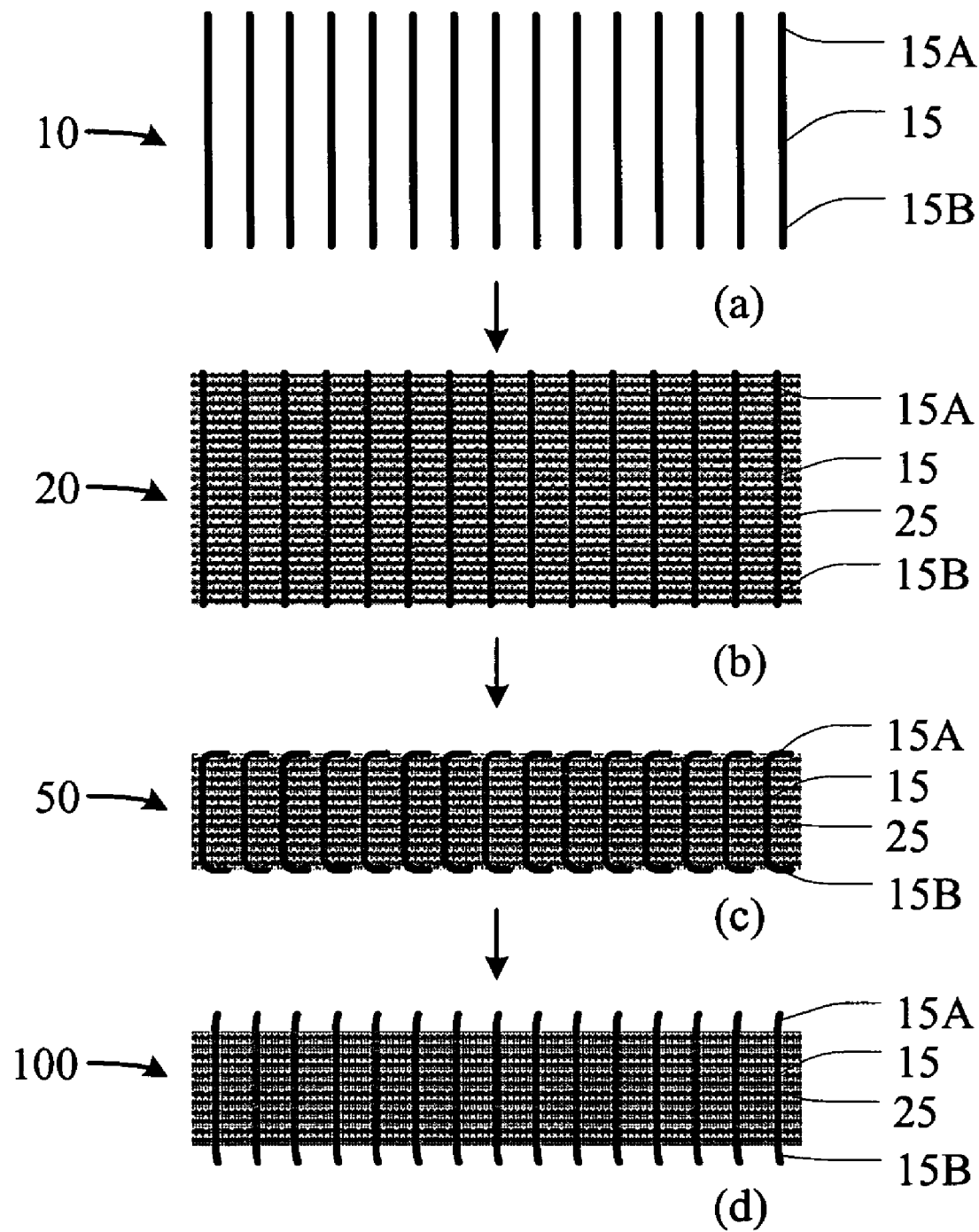
FIG. 1 is a schematic flow chart of a method for manufacturing a thermal interface material in accordance with an embodiment the present invention.

Referring to FIG. 1, a method for making a thermal interface material 100 is provided. The method comprises the steps of:

Step (a), providing a carbon nanotube array 10 formed on a substrate (not shown), the carbon nanotube array 10 comprising a plurality of carbon nanotubes 15 each having a first end 15A and an opposite second end 15B and substantially parallel to each other;

Step (b), forming a composite phase change material 20 by filling clearances in the carbon nanotube array 10 with a phase change material 25;

Step (c), forming a section 50 with predetermined thickness by cutting the composite phase change material 20 along a direction cross to an alignment direction of the carbon nanotubes 15; and Step (d), heating up the section 50 to a temperature higher than a phase change temperature of the phase change material 25 and cooling down after the two opposite ends 15A and 15B of the carbon nanotubes 15 protruding out of the section 50.

Figure 2:
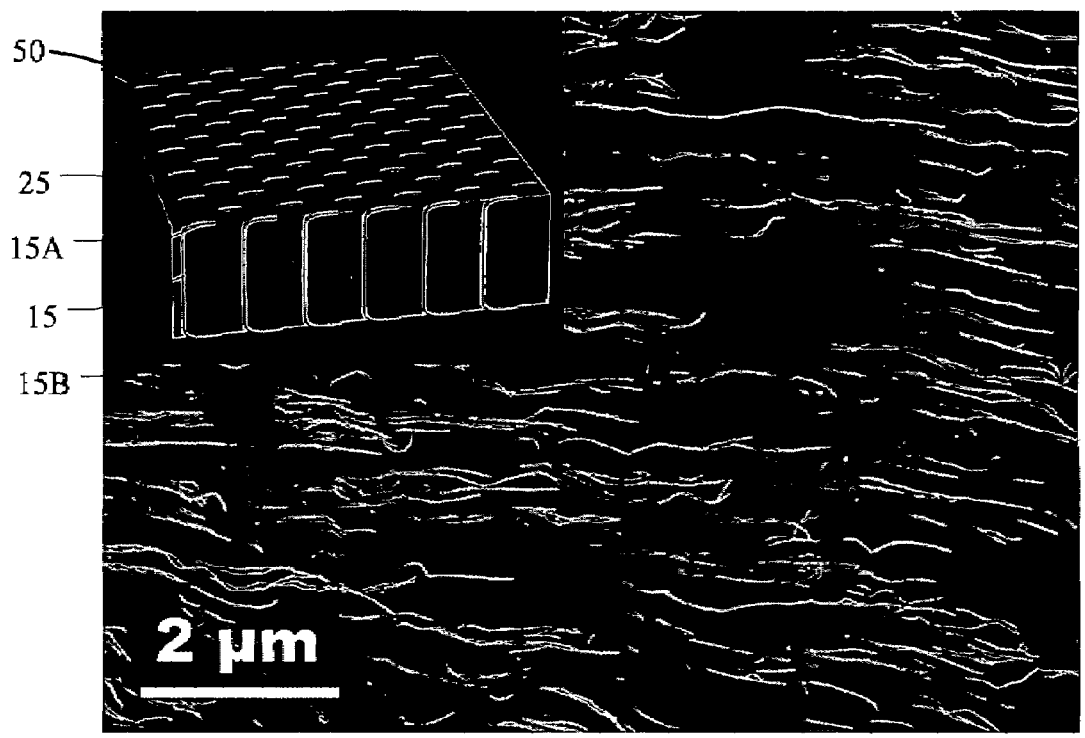
FIG. 2 is a Scanning Electron Microscope (SEM) image of a top view of a surface of a section in accordance with the embodiment the present invention.
Figure 3:
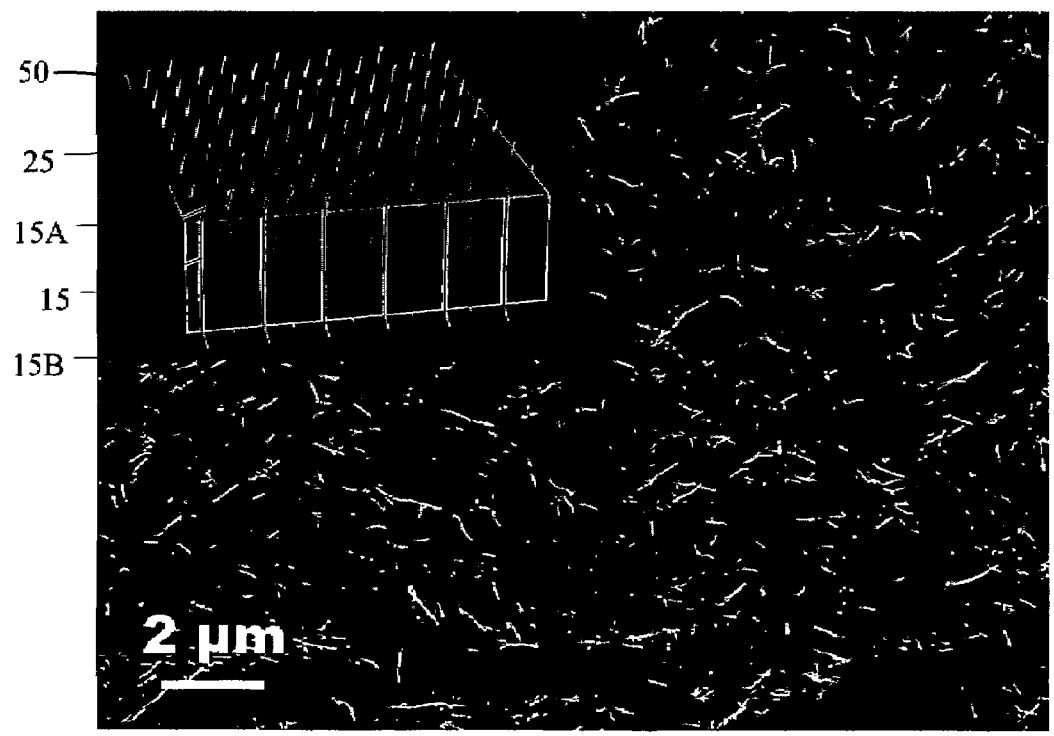
FIG. 3 is an SEM image of a top view of a surface of a thermal interface material in accordance with the embodiment the present invention.

Referring to FIG. 1 to FIG. 3, the method for making the thermal interface material 100 in accordance with the present invention is detail described below and by reference to embodiments.

providing a carbon nanotube array 10 formed on a substrate, the carbon nanotube array 10 comprising a plurality of carbon nanotubes 15 each having a first end 15A and an opposite second end 15B and substantially parallel to each other. The carbon nanotube array 10 is formed a chemical vapor deposition method or a deposition method. The substrate is made from a material selected from the group comprising of glass, silicon, metal, and a metal oxide. In the preferred embodiment, a chemical vapor deposition method is used. Firstly, forming a catalyst (not shown) on the substrate, and then the carbon nanotube array 10 are formed on the catalyst by providing a carbon source gas at high temperature. The catalyst can be made from a material selected from the group comprising iron (Fe), cobalt (Co), nickel (Ni), and palladium (Pd), et al. The carbon source gas can be methane, ethylene, propylene, acetylene, methanol or ethanol. In detail, the substrate is made of silicon. An iron film having a thickness of 5 nm is coating on the substrate, and annealed in air at 300 degrees Celsius as the catalyst. Then the substrate with the catalyst disposed thereon is placed in a chemical vapor deposition chamber (not shown), and a carbon source gas of ethylene is provided in the chemical vapor deposition chamber at a temperature of 700 degrees Celsius to grow the carbon nanotube array 10. The carbon nanotubes 15 of the carbon nanotube array 10 are grown substantially perpendicularly on the substrate.

Step (b), forming a composite phase change material 20 by filling clearances in the carbon nanotube array 10 with a phase change material 25. The filling step is performed by immersing the carbon nanotube array 10 into a melt or solution of the phase change material 25. Curing the phase change material 25 filled in the clearances in the carbon nanotube array 10 in vacuum. The phase change material 25 is selected from the group comprising of paraffin, polyolefine, low molecule polyester, low molecule epoxy resin, and a low molecule acrylic. Due to working temperatures of electronic components are generally ranged from −20 degrees Celsius to 110 degrees Celsius, the phase change material 25 has a phase change temperature in the range from 20 degrees Celsius to 90 degrees Celsius. In the preferred embodiment, paraffin grains (Beijing Shouyi Clinical Medicine Scientific Center, Beijing, China) with a melting point of 52 degrees Celsius to 54 degrees Celsius is employed as the phase change material 25. In detail, the carbon nanotube array 10 is immersed into xylene and heated to 60 degrees Celsius, then put the paraffin grains into xylene. After 2 hours of evaporating of xylene, the carbon nanotube array 10 along with the melt paraffin are transferred to a sectioning mold (Leica, Germany) at the temperature of 60 degrees Celsius. After 30 minutes cooling at room temperature, the paraffin became solidified and the carbon nanotube array 10 is then embedded inside the paraffin, a composite phase change material 20 is formed.

Step (c), forming a section 50 with predetermined thickness by cutting the composite phase change material 20 along a direction cross to an alignment direction of the carbon nanotubes 15. Forming a section 50 by sectioning the composite phase change material 20 along a direction cross to the alignment direction of the carbon nanotubes 15 in accordance with required thickness of the thermal interface material 100. The thickness of the section 50 is ranged from 1 µm to 100 µm. In the preferred embodiment, the sectioning process is performed using a rotary microtome (Leica RM 2245, Germany) and steel knives. The direction cross to the alignment direction of the carbon nanotubes 15 is a direction perpendicular to the alignment direction of the carbon nanotubes 15. Cutting along a direction perpendicular to the alignment direction of the carbon nanotubes 15, and cut to sections of 20 µm thick. FIG. 2 is a Scanning Electron Microscope (SEM) image of a top view of a cutting surface of the section 50. The two opposite ends 15A and 15B of the carbon nanotubes 15 are bent in compliance with the cutting knife and are all aligned along the cutting direction and embedded inside two cutting surfaces of the section 50. As illustrated by the model shown in the inset of FIG. 2, all carbon nanotubes 15 in the section 50 are in the shape of 'U' and formed a carbon nanotubes array 15 of aligned carbon nanotubes 15 with bent ends 15A and 15B. It is noted that, the crossing angle between the sectioning direction and the alignment direction of the carbon nanotubes 15 can also be other values, such as 60 degree or 80 degree, so as the carbon nanotubes 15 of the carbon nanotube array 10 form heat conduction paths between the two cutting surfaces of the section 50. Due to different sectioning directions, bending directions of the two opposite ends 15A and 15B of the carbon nanotubes 15 are different, so the carbon nanotubes 15 in the section 50 can be formed in other shapes, for example, in the shape of "Z".

Step (d), heating up the section 50 to a temperature higher than a phase change temperature of the phase change material 25 and cooling down after the two opposite ends 15A and 15B of the carbon nanotubes 15 protruding out of the section 50. In the preferred embodiment, the section 50 is heating to 60 degrees Celsius and the paraffin began to melt. Thereby, the embedded bent ends 15A and 15B of the carbon nanotubes 15 began to restore their original shape and protruding out of cutting surfaces of the section 50 due to high modulus of carbon nanotubes. Then, a thermal interface material 100 is formed by cooling down the section 50. FIG. 3 is an SEM image of a top view of a surface of the thermal interface material 100. As illustrated by the model shown in the inset of FIG. 2, the two opposite ends 15A and 15B of the carbon nanotubes 15 are protruding out of corresponding surfaces of the thermal interface material 100.

Figure 4:
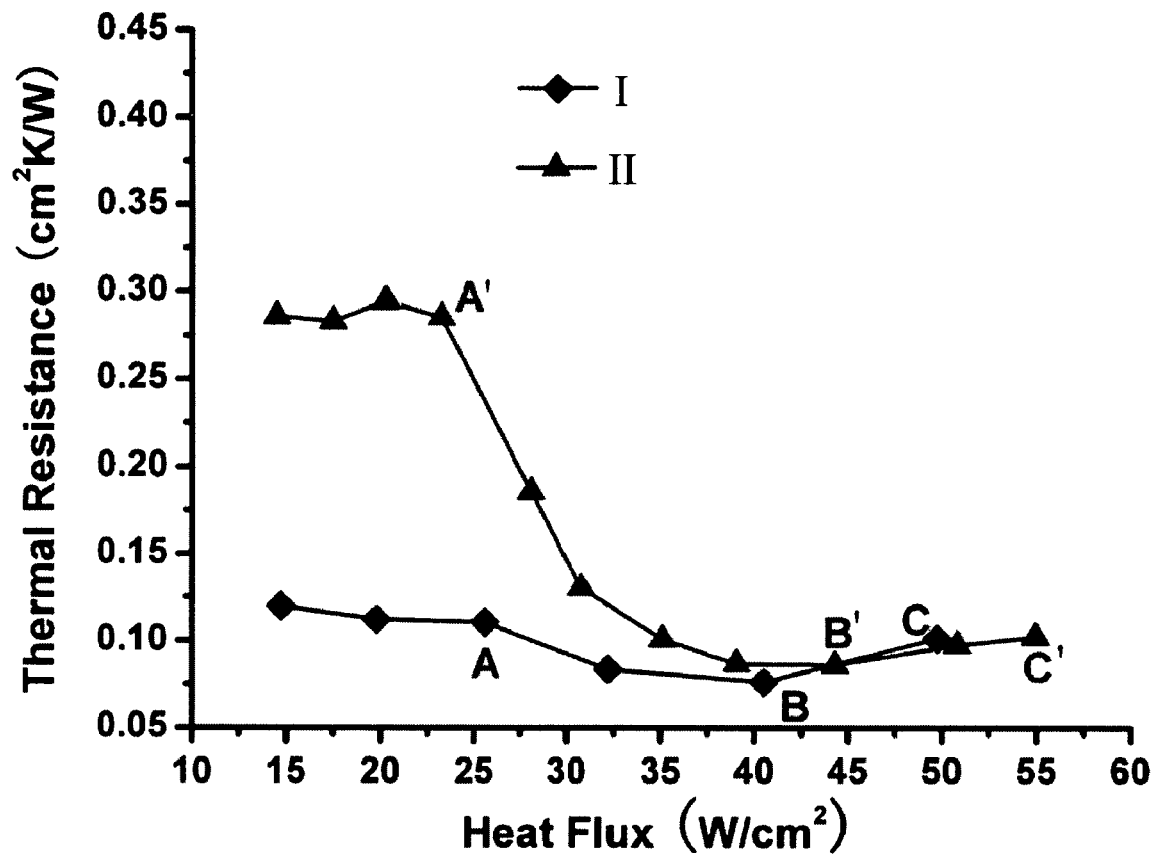
FIG. 4 is a thermal resistance diagram of the section and the thermal interface material in accordance with the embodiment the present invention.

It is noted that, the section 50 provided by the steps (a) to (c) can also be used as a thermal interface material directly. Referring to FIG. 4, the thermal resistances of the section 50 and the thermal interface material 100 are varying with increasing heat flux. The curve I shows a thermal resistance curve of the thermal interface material 100, and the curve II shows a thermal resistance curve of the section 50. With increasing heat flux, after the temperature higher than 44 degrees Celsius (Point A/A), both thermal resistances are reduced obviously to a lowest value 0.08 $cm^2K/W$ (Point B), thereafter, the variation of the thermal resistances are similar (from Point B to Point C). Compare with the section 50 provided by the steps (a) to (c), the thermal interface material 100 in the preferred embodiment can provide very low thermal resistance not only for high heat flux, but also for lower heat flux.

Figure 5:
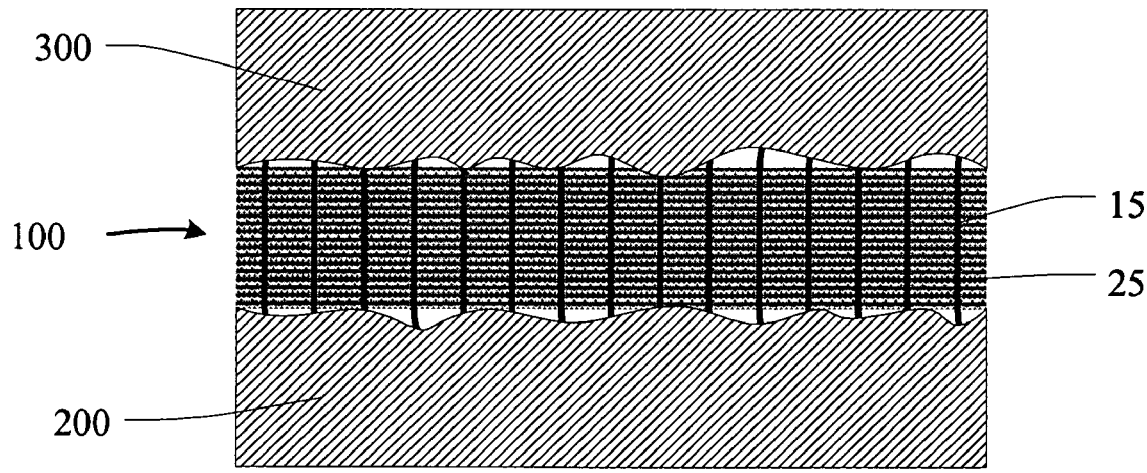
FIG. 5 is a schematic plan view of the thermal interface material of FIG. 3 employed between a heat source and a heat dissipation device.

Referring to FIG. 5, the thermal interface material 100 is employed between a heat source 200 and a heat dissipation device 300. The phase change material 25 itself is a good thermal interface material, when the temperature is higher than the phase change temperature of the phase change material 25, the phase change material 25 is in liquid phase, thereby, the clearances between the heat source 200 and the heat dissipation device 300 can be filled effectively. Furthermore, the carbon nanotubes array 10 of the thermal interface material 100 can provide high thermal conductivity. In an embodiment wherein a content of the carbon nanotubes array 10 in the thermal interface material 100 is 0.2% by volume, the thermal conductivity of the thermal interface material 100 is 5 W/m·K. The thermal conductivity is increased according the increased content of the carbon nanotubes array 10. In another embodiment wherein a content of the carbon nanotubes array 10 in the thermal interface material 100 is 10% by volume, the thermal conductivity of the thermal interface material 100 is 250 W/m·K. In addition, because the thickness of the thermal interface material 100 is on a micron scale, the thermal interface material 100 has good flexibility. Thus, even if the surfaces of the heat source 200 and the heat dissipation device 300 are uneven, the thermal interface material 100 can provide good heat contact therebetween. The two opposite ends 15A and 15B of the carbon nanotubes 15 are protruding out of corresponding surfaces of the thermal interface material 100. This ensures that heat conduction paths formed by the carbon nanotubes 15 contact the heat source 200 and the heat dissipation device 300 directly, and the overall thermal resistance of the thermal interface material is reduced thereby.

It is believed that the present embodiments and their advantages will be understood from the foregoing description, and it will be apparent that various changes may be made thereto without departing from the spirit and scope of the invention or sacrificing all of its material advantages, the examples hereinbefore described merely being preferred or exemplary embodiments of the invention.

We claim:

1. A method for manufacturing a thermal interface material comprising the steps of:
    providing a carbon nanotube array comprising a plurality of carbon nanotubes each having two opposite ends;
    forming a composite phase change material by filling clearances in the carbon nanotube array with a paraffin;
    cutting the composite phase change material to form a section and bending the ends of the carbon nanotubes, wherein the cutting of the composite phase change material is done along a direction that is at an angle to an alignment direction of the carbon nanotubes and bends the ends of the carbon nanotubes; and
    heating the section to a temperature of 60 degrees Celsius until the ends of the carbon nanotubes become unbent and protrude out of the section.

2. The method for manufacturing a thermal interface material in accordance with claim 1, wherein the step of forming the composite phase change material comprising steps of:
    immersing the carbon nanotube array into xylene;
    putting paraffin into the xylene at 60 degrees Celsius;
    evaporating the xylene; and
    cooling the paraffin down.

3. The method for manufacturing a thermal interface material in accordance with claim 1, wherein the carbon nanotubes are formed by a chemical vapor deposition method or a deposition method.

4. The method for manufacturing a thermal interface material in accordance with claim 3, wherein a catalyst used in the chemical vapor deposition method is made from a material selected from the group comprising of iron, cobalt, nickel, and palladium.

5. The method for manufacturing a thermal interface material in accordance with claim 3, wherein a carbon source gas used in the chemical vapor deposition method is selected from the group comprising of methane, ethylene, propylene, acetylene, methanol, and ethanol.

6. The method for manufacturing a thermal interface material in accordance with claim 1, wherein the carbon nanotubes are substantially parallel to each other.

7. The method for manufacturing a thermal interface material in accordance with claim 1, wherein a thickness of the section is in a range from about 1 µm to about 100 µm.

8. The method for manufacturing a thermal interface material in accordance with claim 1, wherein a content of the carbon nanotubes array in the thermal interface material is in a range from about 0.2% to about 10% by volume.

9. The method for manufacturing a thermal interface material in accordance with claim 1, wherein a content of the carbon nanotubes array in the thermal interface material is about 10% by volume.

10. The method for manufacturing a thermal interface material in accordance with claim 1, wherein a content of the carbon nanotubes array in the thermal interface material is about 0.2% by volume.

11. The method for manufacturing a thermal interface material in accordance with claim 1, wherein the angle is approximately ninety degrees.

12. The method for manufacturing a thermal interface material in accordance with claim 1, wherein after cutting the composite phase change material, the carbon nanotubes in the section are in the shape of a "U".

13. The method for manufacturing a thermal interface material in accordance with claim 1, wherein after cutting the composite phase change material, the carbon nanotubes in the section are formed in the shape of a "Z".

14. The method for manufacturing a thermal interface material in accordance with claim 1, wherein bending directions of the ends of the carbon nanotubes varies according to the direction of the cutting of the composite phase change material.

15. A method for manufacturing a thermal interface material comprising the steps of:
    providing a composite phase change material comprising of carbon nanotube array comprising a plurality of carbon nanotubes each having two opposite ends and a paraffin filling clearances within the carbon nanotube array;
    cutting the composite phase change material to form a section and bending the ends of the carbon nanotubes, wherein the cutting of the composite phase change material bends the ends of the carbon nanotubes and is done along a direction that is at an angle to an alignment direction of the carbon nanotubes; and
    heating the section until the ends of the carbon nanotubes become unbent and protrude out of the section.

* * * * *